(12) United States Patent
Aleshin et al.

(10) Patent No.: US 6,988,260 B2
(45) Date of Patent: Jan. 17, 2006

(54) METHOD AND APPARATUS FOR OPTIMIZING FRAGMENTATION OF BOUNDARIES FOR OPTICAL PROXIMITY CORRECTION (OPC) PURPOSES

(75) Inventors: Stanislav V. Aleshin, Moscow (RU); Marina M. Medvedeva, Moscow (RU); Sergei B. Rodin, Moscow (RU); Eugeni E. Egorov, Moscow (RU)

(73) Assignee: LSI Logic Corporation, Milpitas, CA (US)

( * ) Notice: Subject to any disclaimer, the term of this patent is extended or adjusted under 35 U.S.C. 154(b) by 111 days.

(21) Appl. No.: 10/739,460

(22) Filed: Dec. 18, 2003

(65) Prior Publication Data

US 2005/0138597 A1    Jun. 23, 2005

(51) Int. Cl.
*G06F 17/50* (2006.01)

(52) U.S. Cl. .......................................... 716/21; 716/19

(58) Field of Classification Search ............ 716/19–21; 430/5, 22
See application file for complete search history.

(56) References Cited

U.S. PATENT DOCUMENTS

| | | |
|---|---|---|
| 6,249,904 B1 * | 6/2001 | Cobb .......................... 716/21 |
| 6,269,472 B1 | 7/2001 | Garza et al. .................. 716/21 |
| 6,611,953 B1 | 8/2003 | Filseth et al. ................. 716/19 |
| 6,687,895 B2 * | 2/2004 | Zhang .......................... 716/19 |

* cited by examiner

*Primary Examiner*—Paul Dinh
(74) *Attorney, Agent, or Firm*—Suiter West Swantz PC LLO (57) ABSTRACT

The present invention is directed to a method and apparatus for optimizing fragmentation of integrated circuit boundaries for optical proximity correction (OPC) purposes. The present invention may balance the number of vertices and the "flexibility" of the boundary and may recover fragmentation according to the process intensity profile along the ideal edge position to obtain the best decision for OPC.

15 Claims, 7 Drawing Sheets

METHOD AND APPARATUS FOR OPTIMIZING FRAGMENTATION OF BOUNDARIES FOR OPTICAL PROXIMITY CORRECTION (OPC) PURPOSES

CROSS-REFERENCE TO RELATED DOCUMENTS

The present application herein incorporates the following by reference in their entirety: (1) U.S. patent application Ser. No. 09/879,664, entitled "Mask Correction for Photolithographic Processes", filed Jun. 12, 2001; and (2) N. Cobb, "Fast Optical and Process Proximity Correction Algorithms for Integrated Circuit Manufacturing," Ph.D. Thesis, Department of Electrical Engineering and Computer Sciences, University of California at Berkeley, May 1998.

FIELD OF THE INVENTION

The present invention generally relates to the field of integrated circuits, and particularly to a method and apparatus for optimizing fragmentation of boundaries for optical proximity correction (OPC) purposes.

BACKGROUND OF THE INVENTION

With the advance of technology in integrated circuits (ICs), the minimum feature sizes of ICs have been shrinking for years. Commensurate with this size reduction, various process limitations have made IC fabrication more difficult. One area of fabrication technology in which such limitations have appeared is photolithography. Photolithography involves selectively exposing regions of a resist coated silicon wafer to a radiation pattern, and then developing the exposed resist in order to selectively protect regions of wafer layers (e.g., regions of substrate, polysilicon, or dielectric).

An integral component of a photolithographic apparatus is a "mask" or "reticle" which includes a pattern corresponding to features at one layer in an IC design. Such reticle may typically include a transparent glass plate covered with a patterned light blocking material such as chromium. The reticle may be placed between a radiation source producing radiation of a pre-selected wavelength and a focusing lens which may form part of a "stepper" apparatus. Placed beneath the stepper may be a resist covered silicon wafer. When the radiation from the radiation source is directed onto the reticle, light may pass through the glass (regions not having chromium patterns) and project onto the resist covered silicon wafer. In this manner, an image of the reticle may be transferred to the resist. The resist (sometimes referred to as a "photoresist") is provided as a thin layer of radiation-sensitive material that is spin-coated over the entire silicon wafer surface.

As light passes through the reticle, the light may be refracted and scattered by the chromium edges. This may cause the projected image to exhibit some rounding and other optical distortion. While such effects pose relatively little difficulty in layouts with large feature sizes (e.g., layouts with critical dimensions above about 1 micron), the effects may not be ignored in layouts having features smaller than about 1 micron. The problems become especially pronounced in IC designs having feature sizes near the wavelength of light used in the photolithographic process. Optical distortions commonly encountered in photolithography may include rounded corners, reduced feature widths, fusion of dense features, shifting of line segment positions, and the like. Unfortunately, any distorted illumination pattern may propagate to a developed resist pattern and ultimately to IC features such as polysilicon gate regions, vias in dielectrics, and the like. As a result, the IC performance may be degraded or the IC may become unusable.

To remedy this problem, a reticle correction technique known as optical proximity correction ("OPC") has been developed. Optical proximity correction may involve adding regions to and/or subtracting regions from a reticle design at locations chosen to overcome the distorting effects of diffraction and scattering. Typically, OPC is performed on a digital representation of a desired IC pattern. First, the digital pattern may be evaluated with software to identify regions where optical distortion will result. Then the optical proximity correction may be applied to compensate for the distortion. The resulting pattern may be ultimately transferred to the reticle glass. OPC may add various "corrections" to base features. For example, some correction may take the form of "serifs," which are small appendage-type addition or subtraction regions typically made at corner regions on reticle designs. These "serifs" may have the intended effect of "sharpening" the corners of the illumination pattern on the wafer surface.

With OPC, the boundary of an IC design often needs to be moved and/or distorted. In order to get a better correction, it is often useful to introduce more vertices on the boundary to give the IC designer more freedom to design the IC. However, as the number of the vertices grows, the complexity of the masks (thus the cost) may grow. In addition, during the OPC process the fragment of the boundary edge often moves at an essential distance from its initial position, resulting in more complex structure with higher density than the initial design. This may cause different process intensity.

Therefore, it would be desirable to provide a method and apparatus for optimizing fragmentation of boundaries for OPC purposes, which may balance the number of vertices and the "flexibility" of the boundary and may recover fragmentation according to the process intensity profile along the ideal edge position to obtain the best decision for OPC.

SUMMARY OF THE INVENTION

Accordingly, the present invention is directed to a method and apparatus for optimizing fragmentation of boundaries for optical proximity correction (OPC) purposes. The present invention may balance the number of vertices and the "flexibility" of the boundary and may recover fragmentation according to the process intensity profile along the ideal edge position to obtain the best decision for OPC.

In an exemplary aspect of the present invention, a method for optimizing fragmentation of integrated circuit boundaries for optical proximity correction (OPC) purposes may include the following steps: (a) providing a segment S of an integrated circuit boundary and a neighborhood of the integrated circuit boundary as input, the segment S having a first end B and a second end E; (b) placing elements (B,0) and (E,0) into a set Ms, an element in the set Ms having a first component representing a point on the segment S and a second component representing a numeric value; (c) when a length of the segment S is not less than $(D_{min}+2 \cdot D_{serif})$, placing elements $(B_{serif},0)$ and $(E_{serif},0)$ into the set Ms, wherein $B_{serif}$ is a beginning serif point on the segment S with a distance between B and $B_{serif}$ being equal to $D_{serif}$, $E_{serif}$ is an end serif point on the segment S with a distance between E and $E_{serif}$ being equal to $D_{serif}$, $D_{serif}$ is a serif size for the segment S, and $D_{min}$ is a minimal allowed distance between any two fragmentation points on the segment S; (d)

projecting at least one vertex, other than B and E, of the integrated circuit boundary and the neighborhood to the segment S to form at least one projection point P with a corresponding distance D between a vertex and the segment S; (e) when P lies on the segment S, adding an element (P,D) to the set Ms; (f) when an element (P',D') of the set Ms is such that a distance between the point P' and the point B or between the point P' and the point E is less than $D_{min}$, and when the point P' is neither the point B nor the point E, removing the element (P',D') from the set Ms; (g) when the element ($B_{serif}$,0) is in the set Ms, when an element ($P_i$, $D_i$) of the set Ms is such that the point $P_i$ lies between B and $B_{serif}$, and when another element ($P_i'$, $D_i'$) of the set Ms is such that a distance between the point $P_i'$ and the end $B_{serif}$ is less than $D_{min}$, removing the element ($B_{serif}$,0) from the set Ms; (h) when the element ($E_{serif}$,0) is in the set Ms, when an element ($P_i''$,$D_i''$) of the set Ms is such that the point $P_i''$ lies between E and $E_{serif}$, and when another element ($P_i'''$, $D_i'''$) of the set Ms is such that a distance between the point $P_i'''$ and the end $E_{serif}$ is less than $D_{min}$, removing the element ($E_{serif}$,0) from the set Ms; (i) searching for a unworkable element for all elements of the set Ms; and (j) when no unworkable element is found for all elements of the set Ms, defining first components of elements in the set Ms as fragmentation points for the segment S.

In an additional exemplary aspect of the present invention, a method for performing mask edge fragmentation of an integrated circuit design edge may include the following steps: (a) making initial edge fragmentation of an IC design edge; (b) performing an aerial image calculation of the IC design edge; (c) building process intensity profiles at ideal edge positions along the IC design edge; (d) selecting new fragmentation points for the IC design edge; and (e) changing edge fragmentation of the IC design edge.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
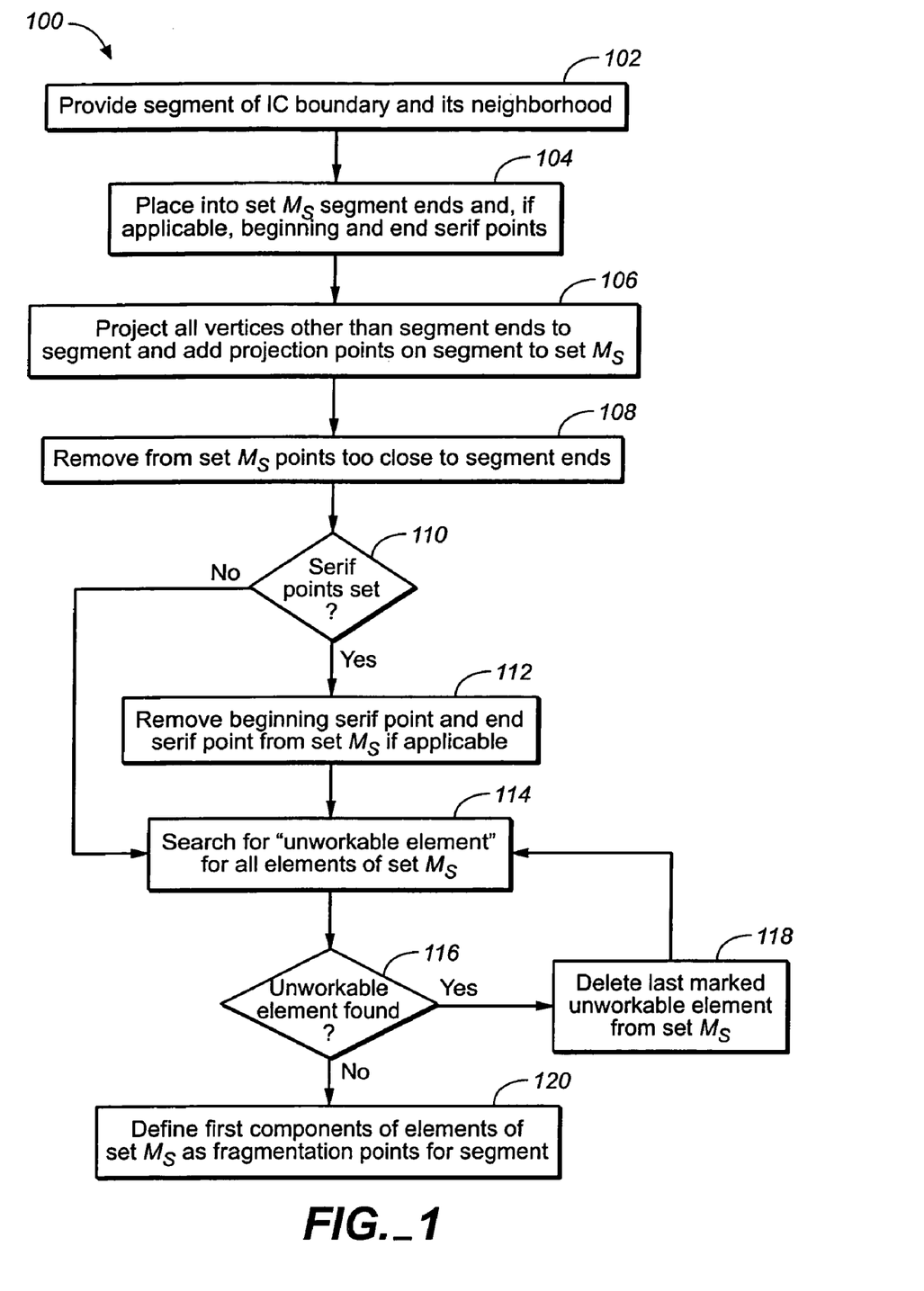
FIG. 1 illustrates a flowchart showing an exemplary method for optimizing fragmentation of boundaries for optical proximity correction (OPC) purposes in accordance with the present invention.

Referring first to FIG. 1, a flowchart showing an exemplary method or process 100 for optimizing fragmentation of boundaries for optical proximity correction (OPC) purposes in accordance with the present invention is shown. The process 100 may start with step 102 in which a segment of an IC boundary and the IC boundary's neighborhood are provided. For example, a segment S of an IC boundary may be provided. The segment S may have two ends: B and E. A serif size for the segment S may be denoted as $D_{serif}$, and a minimal allowed distance between any two fragmentation points on the segment S may be denoted as $D_{min}$.

Then, in step 104, both ends of the segment may be placed into a set Ms and, when the length of the segment is not less than ($D_{min}$+2·$D_{serif}$), both a beginning serif point and an end serif point may be set on the segment and may also be placed into the set Ms. The element of the set Ms may take the form of a pair ($P_i$, $D_i$), where a first component $P_i$ is a point on the segment, and a second component $D_i$ is a numeric value.

In the case of the segment S, elements (B,0) and (E,0) may be added to the set Ms. When the length of the segment S is not less than ($D_{min}$+2·$D_{serif}$), a beginning serif point $B_{serif}$ may be denoted as a point which lies on the segment S with a distance between B and $B_{serif}$ being equal to $D_{serif}$, an end serif point $E_{serif}$ may be denoted as a point which lies on the segment S with a distance between E and $E_{serif}$ being equal to $D_{serif}$, and elements ($B_{serif}$,0) and ($E_{serif}$,0) may be added to the set Ms.

In step 106, all vertices other than the segment ends may be projected to the segment, and when a projection point lies on the segment, the projection point may be added to the set Ms. In the case of the segment S, the projection of each vertex of the IC boundary and its neighborhood may define a distance from the vertex to the segment S. The distance from a vertex A to the segment S may be denoted as $D_A$ and the corresponding projection point may be denoted as $P_A$. When $P_A$ lies on the segment S, the element ($P_A$, $D_A$) may be added to the set Ms. Thus, in the case of the segment S, after the step 106, the set Ms may include the elements (B,0) and (E,0), the elements ($B_{serif}$,0) and ($E_{serif}$,0) (if applicable), and one or more elements ($P_A$, $D_A$) (if applicable). In the following steps of the process 100, fragmentation points of the segment S may be selected from the set Ms.

In step 108, points too close to the segment ends may be removed from the set Ms. In the case of the segment S, if an element ($P_i$, $D_i$) (other than B and E) of the set Ms is such that a distance between $P_i$ and B or between $P_i$ and E is less than $D_{min}$, the element ($P_i$, $D_i$) may be deleted from the set Ms.

Next, in step 110, an inquiry of whether a beginning serif point and an end serif point have been set on the segment may be performed. If the answer is no, the process 100 may proceed to step 114; if the answer is yes, the process 100 may proceed to step 112.

In the step 112, the beginning serif point and the end serif point may be removed from the set Ms. In the case of the segment S, if an element ($P_i$, $D_i$) of the set MS is such that the point $P_i$ lies between B and $B_{serif}$, and if another element ($P_i'$, $D_i'$) of the set Ms is such that a distance between $P_i'$ and $B_{serif}$ is less than $D_{min}$, the element ($B_{serif}$,0) may be removed from the set Ms. Similarly, in the case of the segment S, if an element ($P_i$, $D_i$) of the set Ms is such that the point $P_i$ lies between E and $E_{serif}$ and if another element ($P_i'$, $D_i'$) of the set Ms is such that a distance between $P_i'$ and $E_{serif}$ is less than $D_{min}$, the element ($E_{serif}$,0) may be removed from the set Ms.

Next, in the step 114, a search for a "unworkable element" for all elements (except the segment ends) of the set Ms may be performed.

In the case of the segment S, in step 114-1, an element ($P_1$, $D_1$) of the set Ms may be selected, where the point $P_1$ is closest to the segment end B (but not B). If another element ($P_i$, $D_i$) of the set Ms is such that a distance between $P_1$ and $P_i$ is less than $D_{min}$, then the element ($P_1$, $D_1$) may be marked as a "unworkable element," this distance may be denoted as $D_{unworkable}$, and the distance $D_1$ may be denoted as $D_{unworkable}^{priority}$. Then, in step 114-2, an element ($P_2$, $D_2$) of the set Ms may be selected, where the point $P_2$ is closest to the point $P_1$ and the element ($P_2$, $D_2$) differs from the elements (B,0), (E,0) and ($P_1$, $D_1$). If another element ($P_i$, $D_i$) of the set Ms is such that a distance between $P_2$ and $P_i$ is less than $D_{unworkable}$ or such that a distance between $P_2$ and $P_i$ is equal to $D_{unworkable}$, but $D_2$ is greater than $D_{unworkable}^{priority}$, then the element ($P_2$, $D_2$) may be marked as a "unworkable element," this distance may be denoted as $D_{unworkable}$, and the distance $D_2$ may be denoted as $D_{unworkable}^{priority}$. Next, an element ($P_3$, $D_3$) of the set Ms may be selected, where the point $P_3$ is closest to the point $P_2$ and the element ($P_3$, $D_3$) differs from the elements (B,0), (E,0), ($P_1$, $D_1$), and ($P_2$, $D_2$). Then the step 114-2 may be repeated. The step 114 may be performed for all elements of the set Ms except the elements (B,0) and (E,0).

Then in step 116, an inquiry of whether a unworkable element has been found may be performed. If the answer is yes, the last marked unworkable element may be deleted from the set Ms in step 118, and the process 100 returns to the step 114; if the answer is no (i.e., no element of the set Ms has been marked as "unworkable element"), then the first components of the elements of the set Ms may be defined as fragmentation points for the segment.

Figure 2:
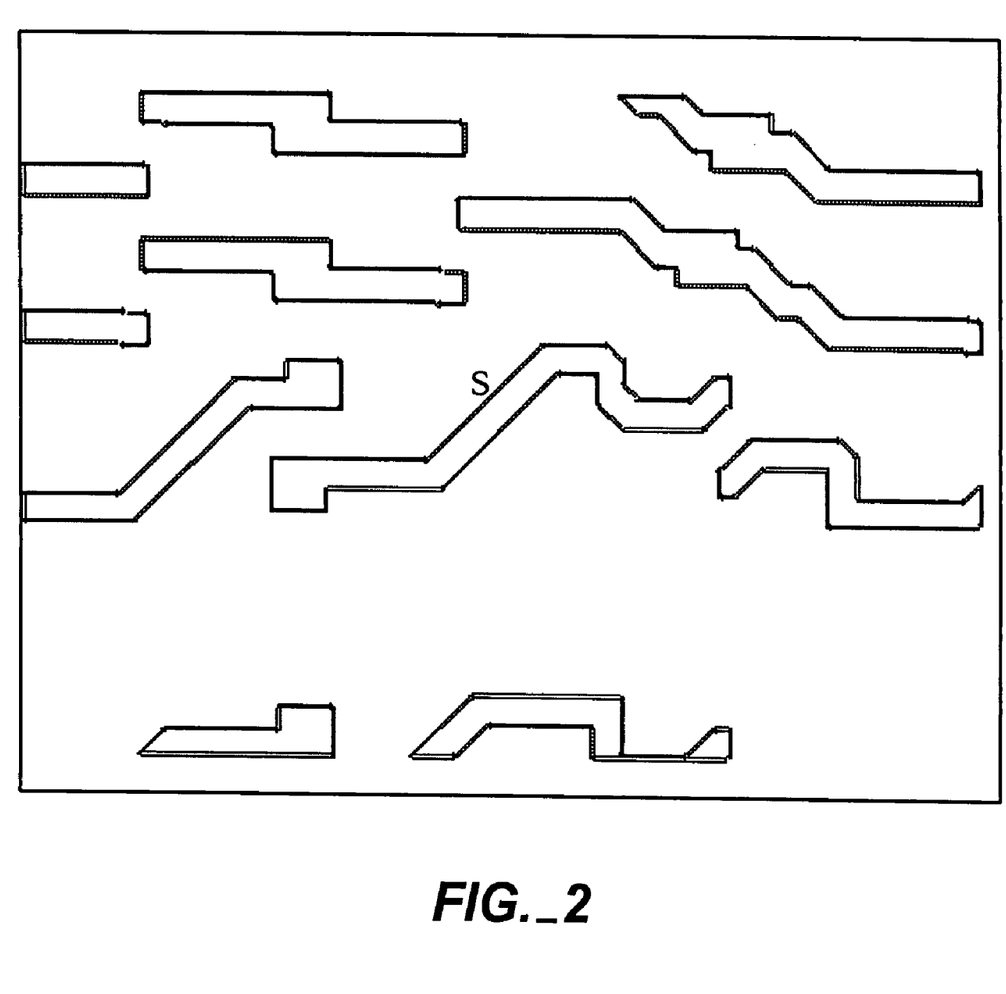
FIG. 2 shows an exemplary segment of an IC boundary and its neighborhood.
Figure 3:
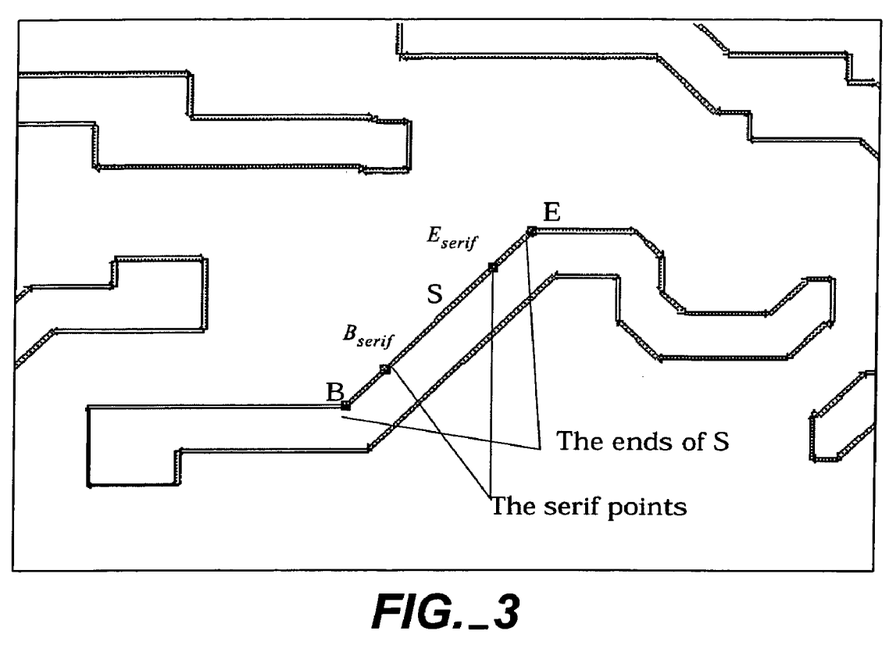
FIG. 3 shows exemplary segment ends and beginning and end serif points on the segment shown in FIG. 2 in accordance with the present invention.
Figure 4:
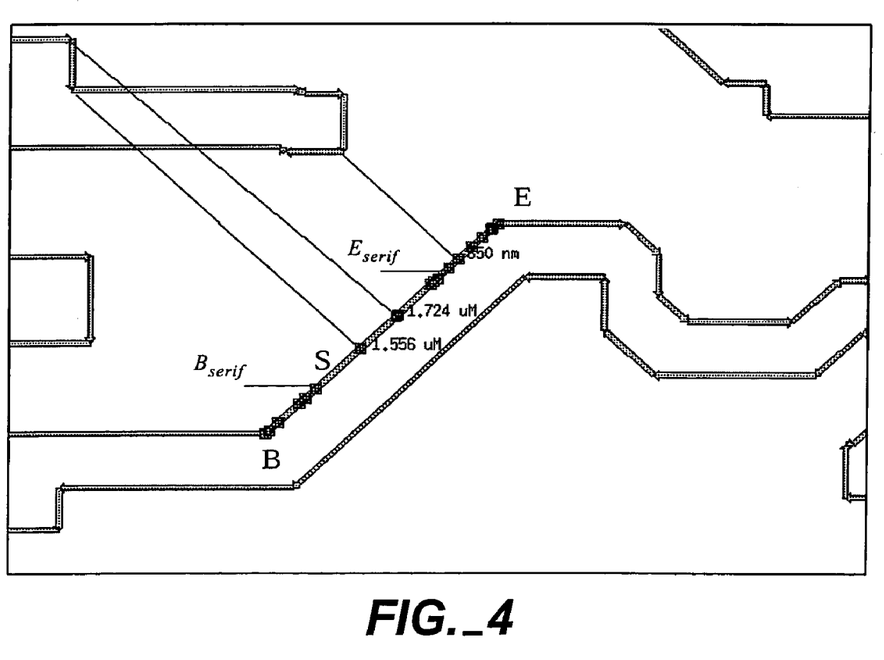
FIG. 4 shows exemplary projection points on the segment shown in FIG. 3 in accordance with the present invention.
Figure 5:
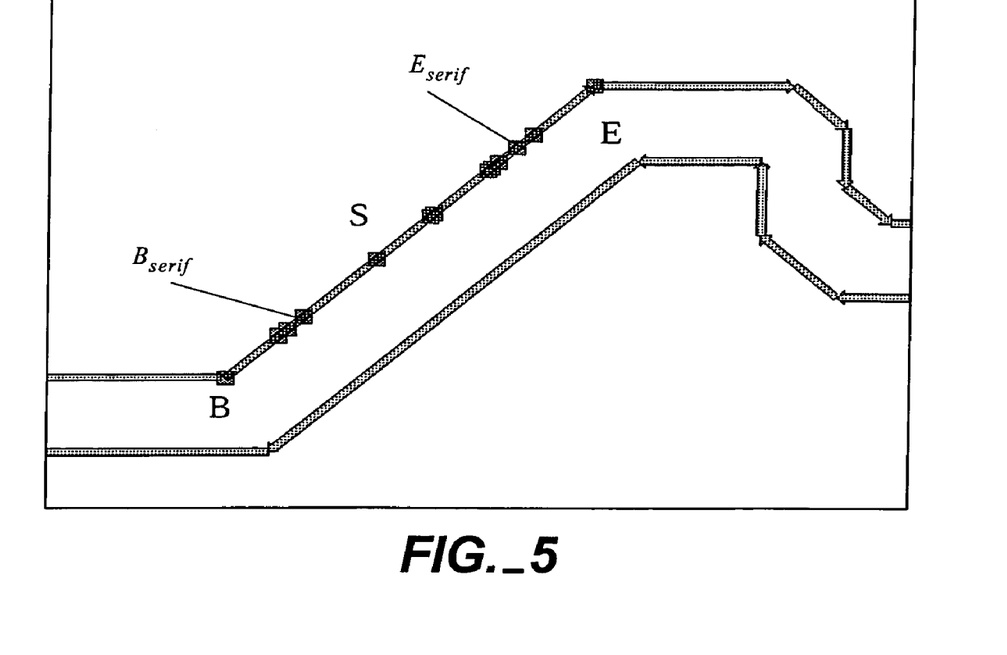
FIG. 5 shows the result after the projection points too close to segments ends are removed from the segment shown in FIG. 4 in accordance with the present invention.
Figure 6:
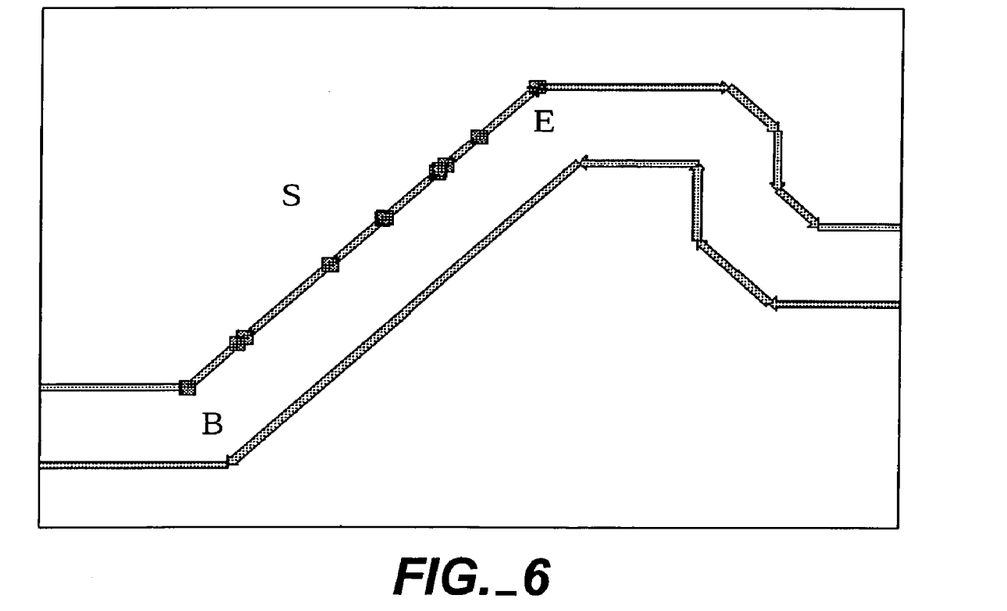
FIG. 6 shows the result after the beginning serif point and the end serif point are removed from the segment shown in FIG. 5 in accordance with the present invention.
Figure 7:
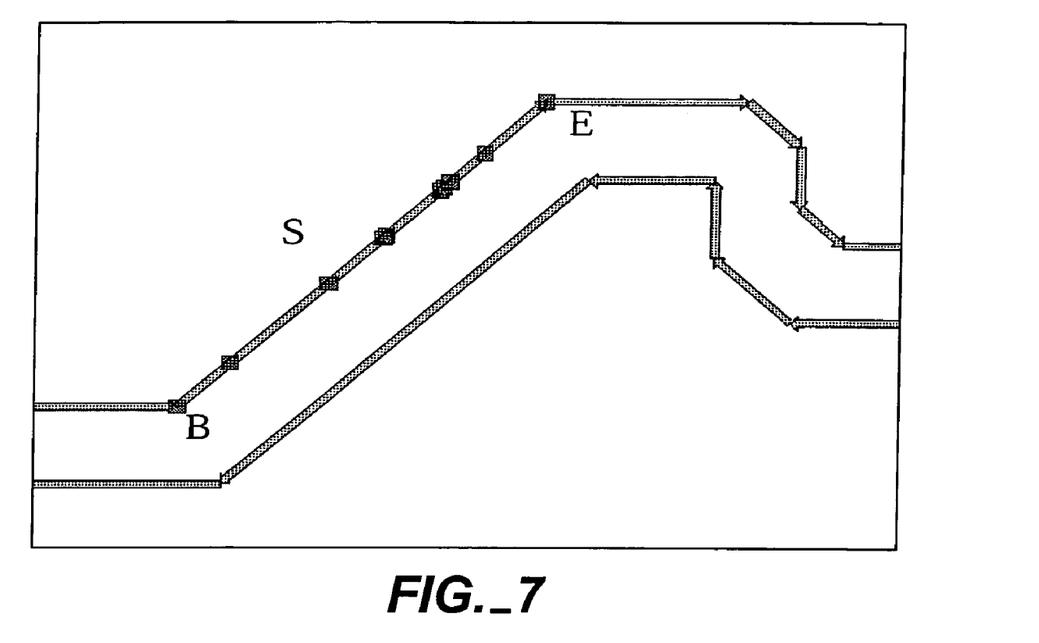
FIG. 7 shows the result after a unworkable point is removed from the segment shown in FIG. 6 in accordance with the present invention.
Figure 8:
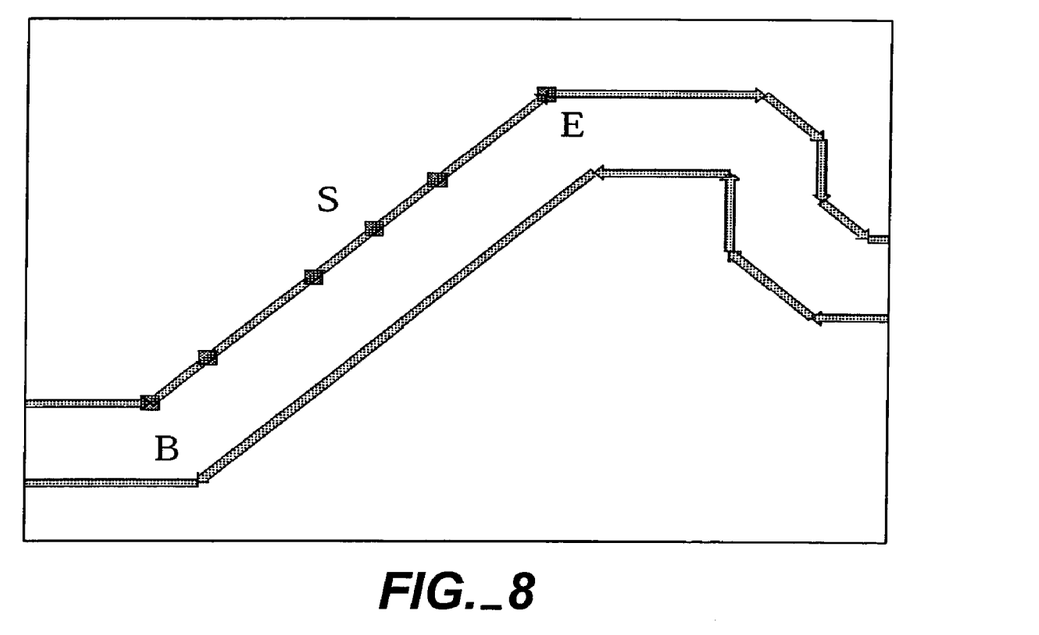
FIG. 8 shows fragmentation points after all unworkable points are removed from the segment shown in FIG. 6 in accordance with the present invention.

FIGS. 2 through 8 show the results after various steps of the present method are performed on an exemplary segment S of an IC boundary in accordance with an exemplary embodiment of the present invention. FIG. 2 shows an exemplary segment S of an IC boundary and its neighborhood. FIG. 3 shows exemplary segment ends B and E and a beginning serif point $B_{serif}$ and an end serif point $E_{serif}$ on the segment S shown in FIG. 2 in accordance with the present invention. FIG. 4 shows exemplary projection points on the segment S shown in FIG. 3 in accordance with the present invention. FIG. 5 shows the result after the projection points too close to the segment ends B and E are removed from the segment S shown in FIG. 4 in accordance with the present invention. FIG. 6 shows the result after the beginning serif point $B_{serif}$ and the end serif point $E_{serif}$ are removed from the segment S shown in FIG. 5 in accordance with the present invention. FIG. 7 shows the result after a unworkable point is removed from the segment S shown in FIG. 6 in accordance with the present invention. FIG. 8 shows fragmentation points after all unworkable points are removed from the segment S shown in FIG. 6 in accordance with the present invention.

It is understood that the segment S shown in FIGS. 2 through 8 is exemplary only and not intended as a structural limitation to the present invention. Those of ordinary skill in the art will understand that the present invention may be applied to various segments of an IC boundary without departing from the scope and spirit of the present invention.

Figure 9:
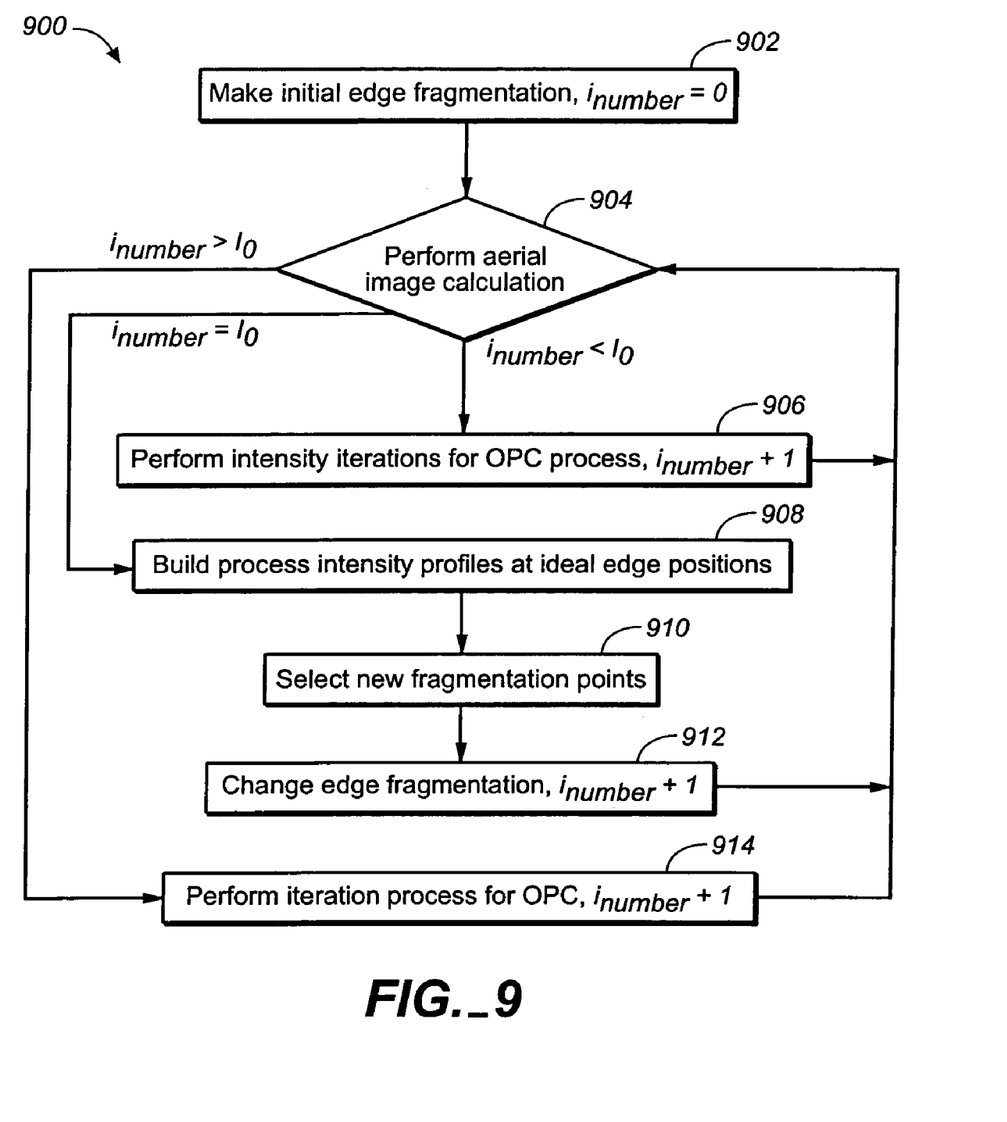
FIG. 9 is a flowchart showing an exemplary method for performing mask edge fragmentation in accordance with the present invention.

Referring now to FIG. 9, a flowchart showing an exemplary method or process 900 for performing mask edge fragmentation in accordance with the present invention is shown. The process 900 may start with step 902 in which initial edge fragmentation is performed and a number $i_{number}$ is given a value "zero" ($i_{number}$=0), where $i_{number}$ is the number of iterations performed. In a preferred embodiment, initial edge fragmentation is performed based on the projection of vertices of the design's boundaries, as shown in FIG. 1. Aerial image calculation or process intensity calculation may be performed 904. For example, the process intensity calculation may be performed as:

$$I(x, y, \vec{a}) = \frac{1}{I_0} \int \int J(x_u, y_u) |E(x, y, x_u, y_u, \vec{a})|^2 dx_u dy_u$$

where $I_0$ is open frame intensity; and $J(x_w, y_w)$ is the intensity distribution at the source surface.

When $i_{number}$ is less than a pre-set value $I_0$ in step 906 intensity iterations for OPC process may be performed, and $i_{number}$ is increased by 1. In a preferred embodiment, intensity iterations for OPC process may be performed as shown in U.S. patent application Ser. No. 09/879,664, entitled "Mask Correction for Photolithographic Processes", filed Jun. 12, 2001. The result of the step 906 is an OPC decision close to the optimal one. Then the process 900 returns to the step 904.

When $i_{number}$ is greater than the pre-set value $I_0$, in step 914 iterations for OPC process may be performed, and $i_{number}$ is increased by 1. The step 914 may be preferably the same as the step 906. Then the process 900 returns to the step 904.

Figure 10:
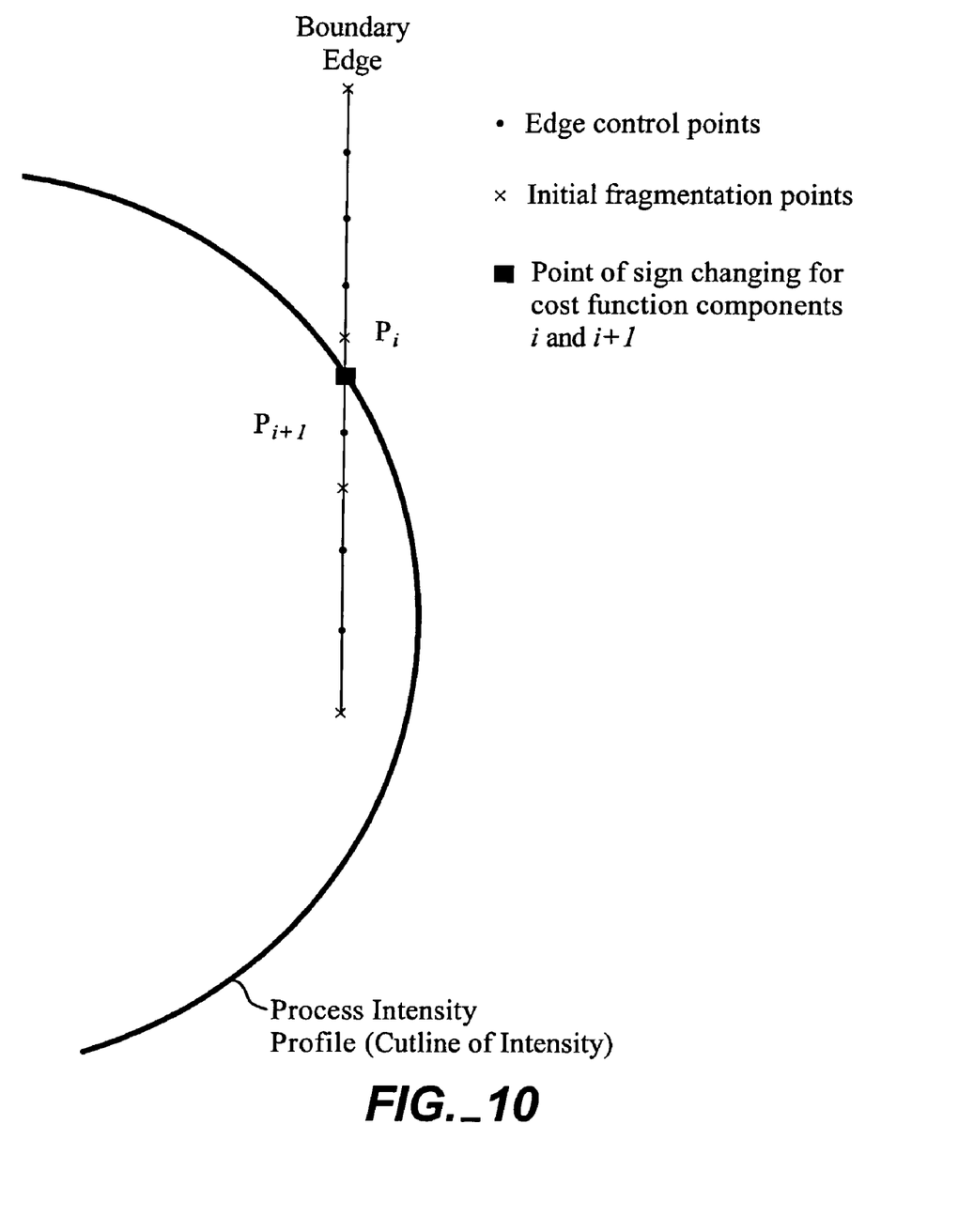
FIG. 10 is an illustration useful in explaining the steps illustrated in FIG. 9.

When $i_{number}$ is equal to the pre-set value $I_0$, process intensity profiles at ideal edge positions may be built 908. The step 908 may be realized by calculation of process intensity values at the set of edge control points, which are the control points for the cost function of the iteration process (see, e.g., FIG. 10). A region of intensity sign changing may be defined as follows:

a) if $\Delta_i = I(p_i) - C^0 > 0$ and $\Delta_{i+1} = I(p_{i+1}) - C^0 < 0$, i= 1, . . . , $P_{edge}-1$, then the ($p_i$, $p_{i+1}$) is the sign changing region of the edge;

b) if $\Delta_i = I(p_i) - C^0 < 0$ and $\Delta_{i+1} = I(p_{i+1}) - C^0 > 0$, i= 1, . . . , $P_{edge}-1$, then the ($p_i$, $p_{i+1}$) is the sign changing region of the edge; and c) if $I(p_{i-1}) < 0$, $I(p_i) = 0$ and $I(p_{i+1}) > 0$, or if $I(p_{i-1}) > 0$, $I(p_i) = 0$ and $I(p_{i+1}) < 0$, i=1, . . . , $P_{edge}-1$, then $p_i$ is the sign changing point, where $I(p_i)$ is the process intensity value at the i-th point on the edge; $C^0$ is the desired intensity value (cutline of the aerial image contour); and $P_{edge}$ is the number of control points on the edge.

When a distance between control points is small (e.g., 0.1–0.3 of wavelength), the curve of the light intensity along the edge between points $p_i$ and $p_{i+1}$ may be presumed to change linearly. Thus, for the foregoing cases a) and b), linear approximation may be used for a distance between a sign changing point and the point $p_i$:

$$\Delta = \frac{|I(p_i) - C^0| \cdot deltaP}{|I(p_i) - C^0| + |I(p_{i+1}) - C^0|}$$

where deltaP is the distance between control points $p_i$ and $p_{i+1}$ along the segment. Thus, new fragmentation points corresponding to the new design process intensity may be found. These new points may be added to the list of fragmentation points for the segment.

New fragmentation points may be selected from the list of fragmentation points for the segment 910. Denote the minimal allowed distance between the fragmentation points as $D_{min}$. It is noted that this distance $D_{min}$ is chosen so that the distance between any pair of the points are greater than $D_{min}$. For each new point added to the list in the step 908, distances between this point and its neighbors may be checked. If a distance between this point and one neighbor point is less than $D_{min}$, the neighbor point need be deleted from the list. As a result, the list of fragmentation points for the segment may define the fragmentation points for the edge. Then, in step 912, edge fragmentation is changed and $i_{number}$ is increased by 1. Next, the process 900 returns to the step 904.

It is to be noted that the above described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of software package. Such a software package may be a computer program product which employs a storage medium including stored computer code which is used to program a computer to perform the disclosed function and process of the present invention. The storage medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for optimizing fragmentation of integrated circuit boundaries for optical proximity correction (OPC) purposes, comprising steps of:

(a) providing a segment of an integrated circuit boundary and a neighborhood of said integrated circuit boundary, said segment having a first end B and a second end E;

(b) placing elements (B,0) and (E,0) into a set Ms, an element in said set Ms having a first component representing a point on said segment and a second component representing a numeric value;

(c) when a length of said segment is not less than $(D_{min}+2 \cdot D_{serif})$, placing elements $(B_{serif},0)$ and $(E_{serif},0)$ into said set Ms, wherein said $B_{serif}$ is a beginning serif point on said segment with a distance between said B and said $B_{serif}$ being equal to said $D_{serif}$, said $E_{serif}$ is an end serif point on said segment with a distance between said E and said $E_{serif}$ being equal to said $D_{serif}$, said $D_{serif}$ is a serif size for said segment, and said $D_{min}$ is a minimal allowed distance between any two fragmentation points on said segment;

(d) projecting at least one vertex, other than said B and said E, of said integrated circuit boundary and said neighborhood to said segment to form at least one projection point P with a corresponding distance D between said at least one vertex and said segment;

(e) when said P lies on said segment, adding an element (P,D) to said set Ms;

(f) when an element (P',D') of said set Ms is such that a distance between said point P' and said point B or between said point P' and said point E is less than said $D_{min}$, and when said point P' is neither said point B nor said point E, removing said element (P',D') from said set Ms;

(g) when said element $(B_{serif},0)$ is in said set Ms, when an element $(P_i, D_i)$ of said set Ms is such that said point $P_i$ lies between said B and said $B_{serif}$, and when another element $(P_i', D_i')$ of said set Ms is such that a distance between said point $P_i'$ and said $B_{serif}$ is less than said $D_{min}$, removing said element $(B_{serif},0)$ from said set Ms;

(h) when said element $(E_{serif},0)$ is in said set Ms, when an element $(P_i',D_i')$ of said set Ms is such that said point $P_i''$ lies between said E and said $E_{serif}$ and when another element $(P_i''', D_i''')$ of said set Ms is such that a distance between said point $P_i'''$ and said $E_{serif}$ is less than said $D_{min}$, removing said element $(E_{serif},0)$ from said set Ms;

(i) searching for a unworkable element for all elements of said set Ms; and (j) when no unworkable element is found for all elements of said set Ms, defining first components of elements in said set Ms as fragmentation points for said segment.

2. The method of claim 1, wherein said searching step (i) comprising:

(i1) selecting an element $(P_1, D_1)$ from said set Ms, where said point $P_1$ is closest to said B but not said B; and (i2) when another element $(P_i, D_i)$ of said set Ms is such that a distance between said point $P_i$ and said point $P_1$ is less than said $D_{min}$, marking said element $(P_i, D_1)$ as said unworkable element, and denoting said distance between said point $P_1$ and said point $P_i$ as $D_{unworkable}$, and said $D_1$ as $D_{unworkable}^{priority}$.

3. The method of claim 2, wherein said searching step (i) further comprising:
   (i3) selecting an element $(P_2, D_2)$ from said set Ms, where said point $P_2$ is closest to said point $P_1$ and said element $(P_2, D_2)$ differs from said elements (B,0), (E,0) and $(P_1, D_1)$;
   (i4) when another element $(P_i, D_i)$ of said set Ms is such that a distance between said $P_2$ and said $P_i$ is less than said $D_{unworkable}$ or such that a distance between said $P_2$ and said $P_i$ is equal to said $D_{unworkable}$, but said $D_2$ is greater than said $D_{unworkable}^{priority}$, marking said element $(P_2, D_2)$ as said unworkable element, and denoting said distance between said $P_2$ and said $P_i$ as said $D_{unworkable}$, and said distance $D_2$ as said $D_{unworkable}^{priority}$.

4. The method of claim 3, wherein said searching step (i) further comprising:
   (i5) selecting an element $(P_3, D_3)$ from said set Ms, where said point $P_3$ is closest to said point $P_2$ and said element $(P_3, D_3)$ differs from said elements (B,0), (E,0), $(P_1, D_1)$, and $(P_2, D_2)$; and
   (i6) repeating said step (i4).

5. The method of claim 1, further comprising:
   (k) when at least one unworkable element is found for all elements of said set Ms, removing last marked unworkable element from said set Ms.

6. An apparatus for optimizing fragmentation of integrated circuit boundaries for optical proximity correction (OPC) purposes, comprising:
   (a) means for providing a segment of an integrated circuit boundary and a neighborhood of said integrated circuit boundary, said segment having a first end B and a second end E;
   (b) means for placing elements (B,0) and (E,0) into a set Ms, an element in said set Ms having a first component representing a point on said segment and a second component representing a numeric value;
   (c) when a length of said segment is not less than $(D_{min}+2 \cdot D_{serif})$, means for placing elements $(B_{serif},0)$ and $(E_{serif},0)$ into said set Ms, wherein said $B_{serif}$ is a beginning serif point on said segment with a distance between said B and said $B_{serif}$ being equal to said $D_{serif}$, said $E_{serif}$ is an end serif point on said segment with a distance between said E and said $E_{serif}$ being equal to said $D_{serif}$ said $D_{serif}$ is a serif size for said segment, and said $D_{min}$ is a minimal allowed distance between any two fragmentation points on said segment;
   (d) means for projecting at least one vertex, other than said B and said E, of said integrated circuit boundary and said neighborhood to said segment to form at least one projection point P with a corresponding distance D between said at least one vertex and said segment;
   (e) when said P lies on said segment, means for adding an element (P,D) to said set Ms;
   (f) when an element (P',D') of said set Ms is such that a distance between said point P' and said point B or between said point P' and said point E is less than said $D_{min}$, and when said point P' is neither said point B nor said point E, means for removing said element (P',D') from said set Ms;
   (g) when said element $(B_{serif},0)$ is in said set Ms, when an element $(P_i, D_i)$ of said set Ms is such that said point $P_i$ lies between said B and said $B_{serif}$, and when another element $(P_i', D_i')$ of said set Ms is such that a distance between said point $P_i'$ and said $B_{serif}$ is less than said $D_{min}$, means for removing said element $(B_{serif},0)$ from said set Ms;
   (h) when said element $(E_{serif},0)$ is in said set Ms, when an element $(P_i'',D_i'')$ of said set Ms is such that said point $P_i''$ lies between said E and said $E_{serif}$, and when another element $(P_i''', D_i''')$ of said set Ms is such that a distance between said point $P_i'''$ and said $E_{serif}$ is less than said $D_{min}$, means for removing said element $(E_{serif},0)$ from said set Ms;
   (i) means for searching for a unworkable element for all elements of said set Ms; and
   (j) when no unworkable element is found for all elements of said set Ms, means for defining first components of elements in said set Ms as fragmentation points for said segment.

7. The apparatus of claim 6, wherein said means for searching (i) comprising:
   (i1) means for selecting an element $(P_1, D_1)$ from said set Ms, where said point $P_1$ is closest to said B but not said B; and
   (i2) when another element $(P_i, D_i)$ of said set Ms is such that a distance between said point $P_1$ and said point $P_i$ is less than said $D_{min}$, means for marking said element $(P_1, D_1)$ as said unworkable element, and means for denoting said distance between said point $P_1$ and said point $P_i$ as $D_{unworkable}$, and said $D_1$ as $D_{unworkable}^{priority}$.

8. The apparatus of claim 7, wherein said means for searching (i) further comprising:
   (i3) means for selecting an element $(P_2, D_2)$ from said set Ms, where said point $P_2$ is closest to said point $P_1$ and said element $(P_2, D_2)$ differs from said elements (B,0), (E,0) and $(P_1, D_1)$;
   (i4) when another element $(P_i, D_i)$ of said set Ms is such that a distance between said $P_2$ and said $P_i$ is less than said $D_{unworkable}$ or such that a distance between said $P_2$ and said $P_i$ is equal to said $D_{unworkable}$, but said $D_2$ is greater than said $D_{unworkable}^{priority}$, means for marking said element $(P_2, D_2)$ as said unworkable element, and means for denoting said distance between said $P_2$ and said $P_i$ as said $D_{unworkable}$, and said distance $D_2$ as said $D_{unworkable}^{priority}$.

9. The apparatus of claim 8, wherein said means for searching (i) further comprising:
   (i5) means for selecting an element $(P_3, D_3)$ from said set Ms, where said point $P_3$ is closest to said point $P_2$ and said element $(P_3, D_3)$ differs from said elements (B,0), (E,0), $(P_1, D_1)$, and $(P_2, D_2)$.

10. The apparatus of claim 6, further comprising:
    (k) when at least one unworkable element is found for all elements of said set Ms, means for removing last marked unworkable element from said set Ms.

11. A computer-readable medium having computer-executable instructions for performing a method for optimizing fragmentation of integrated circuit boundaries for optical proximity correction (OPC) purposes, said method comprising steps of:
    (a) providing a segment of an integrated circuit boundary and a neighborhood of said integrated circuit boundary, said segment having a first end B and a second end E;
    (b) placing elements (B,0) and (E,0) into a set Ms, an element in said set Ms having a first component representing a point on said segment and a second component representing a numeric value;
    (c) when a length of said segment is not less than $(D_{min}+2 \cdot D_{serif})$, placing elements $(B_{serif},0)$ and $(E_{serif},0)$ into said set Ms, wherein said $B_{serif}$ is a beginning serif point on said segment with a distance between said B and said $B_{serif}$ being equal to said $D_{serif}$, said $E_{serif}$ is an end serif point on said segment with a distance between said E and said $E_{serif}$ being equal to said $D_{serif}$, said $D_{serif}$ is a serif size for said segment, and said $D_{min}$ is a minimal allowed distance between any two fragmentation points on said segment;

(d) projecting at least one vertex, other than said B and said E, of said integrated circuit boundary and said neighborhood to said segment to form at least one projection point P with a corresponding distance D between said at least one vertex and said segment;

(e) when said P lies on said segment, adding an element (P,D) to said set Ms;

(f) when an element (P',D') of said set Ms is such that a distance between said point P' and said point B or between said point P' and said point E is less than said $D_{min}$, and when said point P' is neither said point B nor said point E, removing said element (P',D') from said set Ms;

(g) when said element ($B_{serif}$,0) is in said set Ms, when an element ($P_i$, $D_i$) of said set Ms is such that said point $P_i$ lies between said B and said $B_{serif}$, and when another element ($P_i'$, $D_i'$) of said set Ms is such that a distance between said point $P_i'$ and said $B_{serif}$ is less than said $D_{min}$, removing said element ($B_{serif}$,0) from said set Ms;

(h) when said element ($E_{serif}$,0) is in said set Ms, when an element ($P_i''$,$D_i''$) of said set Ms is such that said point $P_i''$ lies between said E and said $E_{serif}$, and when another element ($P_i'''$, $D_i'''$) of said set Ms is such that a distance between said point $P_i'''$ and said $E_{serif}$ is less than said $D_{min}$, removing said element ($E_{serif}$,0) from said set Ms;

(i) searching for a unworkable element for all elements of said set Ms; and (j) when no unworkable element is found for all elements of said set Ms, defining first components of elements in said set Ms as fragmentation points for said segment.

12. The computer-readable medium of claim 11, wherein said searching step (i) comprising:
   (i1) selecting an element ($P_1$, $D_1$) from said set Ms, where said point $P_1$ is closest to said B but not said B; and
   (i2) when another element ($P_i$, $D_i$) of said set Ms is such that a distance between said point $P_1$ and said point $P_i$ is less than said $D_{min}$, marking said element ($P_1$, $D_1$) as said unworkable element, and denoting said distance between said point $P_1$ and said point $P_i$ as $D_{unworkable}$, and said $D_1$ as $D_{unworkable}^{priority}$.

13. The computer-readable medium of claim 12, wherein said searching step (i) further comprising:
   (i3) selecting an element ($P_2$, $D_2$) from said set Ms, where said point $P_2$ is closest to said point $P_1$ and said element ($P_2$, $D_2$) differs from said elements (B,0), (E,0) and ($P_1$, $D_1$);
   (i4) when another element ($P_i$, $D_i$) of said set Ms is such that a distance between said $P_2$ and said $P_i$ is less than said $D_{unworkable}$ or such that a distance between said $P_2$ and said $P_i$ is equal to said $D^{unworkable}$, but said $D_2$ is greater than said $D_{unworkable}^{priority}$ marking said element ($P_2$, $D_2$) as said unworkable element, and denoting said distance between said $P_2$ and said $P_i$ as said $D_{unworkable}$, and said distance $D_2$ as said $D_{unworkable}^{priority}$.

14. The computer-readable medium of claim 13, wherein said searching step (i) further comprising:
   (i5) selecting an element ($P_3$, $D_3$) from said set Ms, where said point $P_3$ is closest to said point $P_2$ and said element ($P_3$, $D_3$) differs from said elements (B,0), (E,0), ($P_1$, $D_1$), and ($P_2$, $D_2$); and
   (i6) repeating said step (i4).

15. The computer-readable medium of claim 11, wherein said method further comprising:
   (k) when at least one unworkable element is found for all elements of said set Ms, removing last marked unworkable element from said set Ms.

* * * * *